United States Patent [19]
Li

[11] Patent Number: 5,937,514
[45] Date of Patent: Aug. 17, 1999

[54] METHOD OF MAKING A HEAT-RESISTANT SYSTEM

[76] Inventor: Chou H. Li, 8001 Sailboat Key Blvd., South Pasadena, Fla. 33707

[21] Appl. No.: 08/947,308

[22] Filed: Oct. 8, 1997

Related U.S. Application Data

[63] Continuation-in-part of application No. 08/805,535, Feb. 25, 1997.

[51] Int. Cl.⁶ .................................................. H05K 3/34
[52] U.S. Cl. .............................. 29/840; 29/832; 29/833; 29/740
[58] Field of Search .............................. 29/840, 839, 740, 29/830, 831, 852, 832

[56] References Cited

U.S. PATENT DOCUMENTS

| | | |
|---|---|---|
| 3,777,220 | 12/1973 | Tatusko et al. ...................... 29/832 X |
| 4,294,009 | 10/1981 | Quintin et al. ............................. 29/832 |
| 4,372,037 | 2/1983 | Seapple et al. ....................... 29/832 X |
| 4,732,780 | 3/1988 | Mitoff et al. .......................... 29/852 X |
| 4,851,615 | 7/1989 | Butt ........................................ 29/832 X |
| 4,890,783 | 1/1990 | Li . |
| 5,248,079 | 9/1993 | Li . |
| 5,392,982 | 2/1995 | Li . |
| 5,481,795 | 1/1996 | Hatakayama et al. .................... 29/852 |

*Primary Examiner*—Carl J. Arbes
*Attorney, Agent, or Firm*—Nikaido, Marmelstein, Murray & Oram LLP

[57] ABSTRACT

Methods of making improved electronic systems and circuits boards, and more specifically to methods of making improved electronic systems and circuits boards using heat-resistant composite materials.

50 Claims, 4 Drawing Sheets

METHOD OF MAKING A HEAT-RESISTANT SYSTEM

CROSS REFERENCE TO RELATED APPLICATION

This is a continuation-in-part of U.S. application Ser. No. 08/805,535, filed Feb. 25, 1997. I hereby incorporate by reference this pending application.

BACKGROUND OF THE INVENTION

1. Field of the Invention

This invention relates to methods of making improved electronic systems and circuit boards, and more specifically to methods of making improved electronic systems and circuit boards using heat-resistant composite materials. Various novel heat-resistant electronic systems, circuit boards, non-segregating solid reinforcing elements, and other products based on these methods are also disclosed.

2. Description of Related Art

Electronic systems with modern electronic circuits components or elements are used in almost every industry including manufacturing, servicing, banking, business, financial, medical, and weaponry, as well as in high-speed processors, cellular phones, satellite communication systems, deep-well equipment, jet engines, gas turbines, lap-top personal computers, nuclear reactors, and automobiles or other transportation vehicles. Users of these electronic systems continuously require larger, more powerful, and faster speeds, requiring such systems to posses and better and more processors, transistors, voltage regulators, memory, and other components.

Generally, electronic circuit components or elements are mounted by melting and solidifying a solder metal, on plastic or ceramic circuits boards. Metallic lead wires or lines are provided on the circuit components for use in connecting these circuit components onto the circuit boards. These connecting lines must be as few in number and as short as possible to reduce the electrical resistances, which slow down the speed of the electronic systems. These metallic lines must also be rigid, strong, fatigue-resistant, creep-resistant, and thermally conductive to help dissipate heat. Excessive heat generation from, e.g., high electrical resistances, increases the system temperature, reduces the life of transistors, and lowers the mechanical strength and creep resistance of metallic lead wires, thereby causing run-away deterioration of electrical and thermal resistance, temperatures, transistor life, and lead wire mechanical strengths. The degraded electronic systems directly degrades the performance of any equipment containing such electronic systems.

In many electronic systems, thermal design already is the limiting factor. For example, to handle the heat of a high-power (15.4 W) TO-220 voltage regulator operating with a 233-MHz Pentium chip presents a formidable problem that requires a proper thermal solution without scraping the existing mother-circuit-board architecture. Pentium chips with even higher speeds are already in mass production.

An important consideration in the mechanical, thermal, and electrical design of a circuit board and an electronic system is the fact that many materials are used for the electronic circuit heat-resistant components, the plastic or ceramic circuit board, and the electronic system. In general, the electronic system has a metallic or plastic frame onto which the circuit board substrate is fixedly attached at a specific location thereon. The circuit board is used to electrically and physically connect a number of circuit components together. The circuit board substrate has a large number of through holes. Each electronic circuit component has a number of metallic lead wires embedded into and electrically separated by an encapsulant. All the metallic lead wires on each circuit component extend, and point in a common direction away, i.e., vertically downward as shown in FIG. 7, from the circuit component so that all the extending lead wires can be easily inserted simultaneously into selected through holes at given positions on the circuit board substrate. The inside surfaces of the through holes are coated with specific metal layers to facilitate the wetting and bonding of the inserted metallic lead wires.

Each of the many different materials on the circuit components, the circuit board substate, and the system frame has a specific set of mechanical, electrical, and thermal properties, and a unique thermal expansion coefficient. At the contact area between any two different materials, there is an actual or a residual thermal expansion mismatch that generates thermal mismatch stresses. Specifically, when the electronic system changes in temperature, thermal mismatch stresses are generated between:

1) the metallic lead wires and their encapsulating plastic;
2) the metallic lead wires and the bonded metal layers on the through holes of the circuit board substrate; and
3) the circuit board substrate and the mounting frame of the electronic system.

The thermal mismatch stresses usually are highly localized and can be so very severe as to cause localized metal creep and fractures, or changes in electrical resistances and thermal conductances. Changes in these resistances and conductances are equally, if not more, damaging than other changes to the reliability and life of the circuit components, the circuit board, and the entire electronic system.

Hence, the circuit boards and the electronic systems must have radically improved lead wire connections, which may be fabricated by soldering, brazing, or welding methods. All these methods use molten metal alloys. Soldering metal alloys with melt temperatures below about 250° C. are employed so that low-cost plastic circuit boards may be used. Brazing and welding metal alloys require melt temperatures respectively below and above about 800° C. Such temperatures require ceramic circuit boards. Most such connections now are soldered joints that have:

1) high electrical resistance leading to wasteful heat generation, rise in temperatures, and reduced circuit component speed and life;
2) low thermal conductivity magnifying the problems in 1); and
3) inadequate mechanical strength of the lead wire connections particularly as to creep, fatigue, or shear, making all the bonded lead wires, the circuit board, or even the entire electronic system non heat-resistant, short-lived, and unreliable.

In this invention, the above-mentioned problems of prior-art composites are minimized by a unique, heat-resistant ceramic-reinforced composite material to be shown below.

For purposes of the present invention, a composite is any material that results when two or more materials, each having its own, usually different characteristics, are combined, giving useful properties for specific applications.

Further, when used in the present specification, a matrix is a material in which something is enclosed or embedded.

For purposes of the present invention uniform distribution of solid reinforcing elements in a composite matrix means that the concentration of the solid reinforcing elements in each unit of volume, e.g., cubic millimeter, of the solidified composite matrix is constant or substantially constant throughout the entire composite. In addition, a composite has a matrix component, the matrix component is generally characterized by the composite component that is in the majority. For example, a composite made from 20% by weight solid reinforcing elements and 80% by weight In is characterized as an In matrix composite.

Composites are important structural materials. Oftentimes composites are reinforced by suspending or embedding solid strengthening or reinforcing elements, such as, reinforcing powders, rods, sheets, weaves, or combinations thereof within the composite matrix. Generally, the solid reinforcing elements are rigid and temperature resistant and are thus used to make the entire composite matrix more rigid and temperature resistant. Many other benefits are achieved by reinforcing composites. For example, reinforced composites can be prepared which resist creep, fatigue, and tensile or shear fractures at temperatures which are close to the melting point of the composite matrix.

Reinforcing elements often segregate at corners, edges, and deep but narrow walls such as in a solder joint on a circuit board. Overcrowded reinforcing elements at certain segregated places, such as the bottom for heavier solid reinforcing elements or the top for lighter solid reinforcing elements, causes weakness in the composite matrix.

Reinforced composites are formed by adding solid strengthening or reinforcing elements to a liquid composite matrix followed by solidifying or freezing the mixture to provide a reinforced composite matrix which contains the solid strengthening or reinforcing elements embedded therein. Ideally, the solid reinforcing elements are uniformly distributed in the composite matrix to realize and optimize the desired performance of the reinforced composite matrix. However, it is extremely difficult, if not impossible, to achieve uniform distribution of reinforcing elements in a composite matrix.

The uniform distribution of the solid reinforcing elements in a liquid or solid composite matrix is a critical factor in achieving optimum composite performance. If the solid reinforcing elements are heavier than the composite matrix, they gravitationally segregate at the bottom of the liquid composite matrix during the solidification process. This segregation causes a non-uniform distribution of reinforcing elements in the composite matrix. This overcrowding also reduces the efficacy of these solid reinforcing elements and decreases the usefulness of the resulting reinforcing composite. Solid reinforcing elements float or segregate to the surface of the liquid matrix if they are lighter than the matrix.

Reinforcing elements segregation at corners, edges, and deep but narrow walls is also very common. Overcrowded reinforcing elements at certain segregated places, such as the bottom for heavier solid reinforcing elements or the top for lighter solid reinforcing elements, causes weakness in the composite matrix. In particular, if a composite matrix has too many solid reinforcing elements, it may be even weaker than a composite matrix without any reinforcement. This weakness results because the solid reinforcing elements are not sufficiently supported by, or connected to, the composite matrix which causes localized overstresses, and initiates voids and cracks in the matrix. Similarly, in areas of the composite matrix where solid reinforcing elements are underpopulated, the composite matrix is, of course, weak and not properly reinforced.

Proper reinforcement is also problematic in cases where a composite is narrow and deep, such as between two concentric cylinders, in narrow-clearance soldered joints on the circuit board. In this case the solder composite thickness between the inner and outer cylindrical walls may be less than 1 to 5 mils. Given these parameters, the gravitational segregation of solid reinforcing elements at localized spots may initiate premature composite failures.

Thus, an inferior composite can result because of the differing densities of the liquid composite matrix and the solid reinforcing elements. In particular, solid reinforcing elements sink when suspended in a lighter liquid composite matrix, and float when suspended in a heavier liquid composite matrix. In either case, the solid reinforcing elements segregate due to gravity, resulting in a non-uniform distribution of the solid reinforcing elements in the liquid composite matrix. Further, this non-uniform distribution pattern is carried over during the composite matrix solidification, e.g., freezing or resin polymerization of the composite matrix, resulting in undesirable segregation patterns of the solid reinforcing elements in the resultant solid composite matrix.

Different approaches, having varying degrees of success have attempted to overcome the deficiencies in the prior art reinforced composites. Specifically, a tedious and time-consuming process of hand packing reinforcing elements in a composite matrix has attempted to achieve the desired uniform distribution of the reinforcing elements. In particular, alternate sheets of composite matrix of a first thickness and solid reinforcing sheets or two-dimensional weaves of a second thickness may, for example, be hand-packed together, layer after layer, followed by liquid infiltration and freezing, pressing or thermal polymerization to form a resultant reinforced composite matrix. This process has several shortcomings, including non-uniform distribution of the reinforcing elements caused by shifting or settling of the packed material, irreproducibility of the results packing and excessive expense in forming the reinforced composite.

Another approach which has attempted to provide uniform distribution of reinforcing elements uses a process which suspends the solid reinforcing elements in a liquid or molten composite matrix. This suspension is then injected into and solidified in a mold causing the solid reinforcing element to be frozen in place. However, if the reinforcing elements are non-uniformly distributed in the liquid composite matrix prior to solidification or if the elements settle during the solidification, the final distribution of these elements in the solid composite is also non-uniform.

Thus, what is needed then are methods of making reinforced composites in which the solid reinforcing elements are uniformly, or substantially uniformly distributed in a composite matrix resulting in a composite matrix wherein the concentration of the solid reinforcing elements in each unit of volume, e.g., cubic millimeter, of the solidified composite matrix is constant or substantially constant throughout the entire composite.

In view of the prior art as a whole at the time of the present invention, it was not obvious to those of ordinary skill in the pertinent art how to provide for the heat-resistant, and fabricate reinforced composites for circuit board and electronic systems of the invention.

SUMMARY OF THE INVENTION

Accordingly, a method of making heat-resistant electronic systems, printed circuit boards, and soldered, brazed, or welded joints includes mixing a liquid metal matrix having a preselected liquid density with a plurality of solid reinforcing elements to provide a mixture. Each of the reinforcing elements has an average density substantially equal to the preselected liquid density thereby achieving a substantially uniform and stable distribution of the solid ceramic reinforcing elements in the liquid metal matrix. The liquid metal matrix is then frozen to preserve the uniform and stable distribution in the resultant solid composite and to make the electronic system, circuit board, or bonded joint heat-resistant. Products of the invention in various forms are also disclosed.

The invention accordingly comprises the features that will be exemplified in the description hereafter set forth, and the scope of the invention will be indicated in the claims.

BRIEF DESCRIPTION OF THE DRAWINGS

More features and advantages of the present invention will be more fully apparent from the following detailed description of the preferred embodiment, the appended claims, and the accompanying drawings in which:

DETAILED DESCRIPTION OF THE INVENTION

The long-felt but heretofore unfulfilled need for a method of making an improved composite for heat resistant circuit and electronic systems is now met by a new method of composite formation in which substantially uniform and stable distribution of the reinforcing elements is achieved. I use a special heat-resistant composite solder material to overcome the above-mentioned problems.

Figure 1:
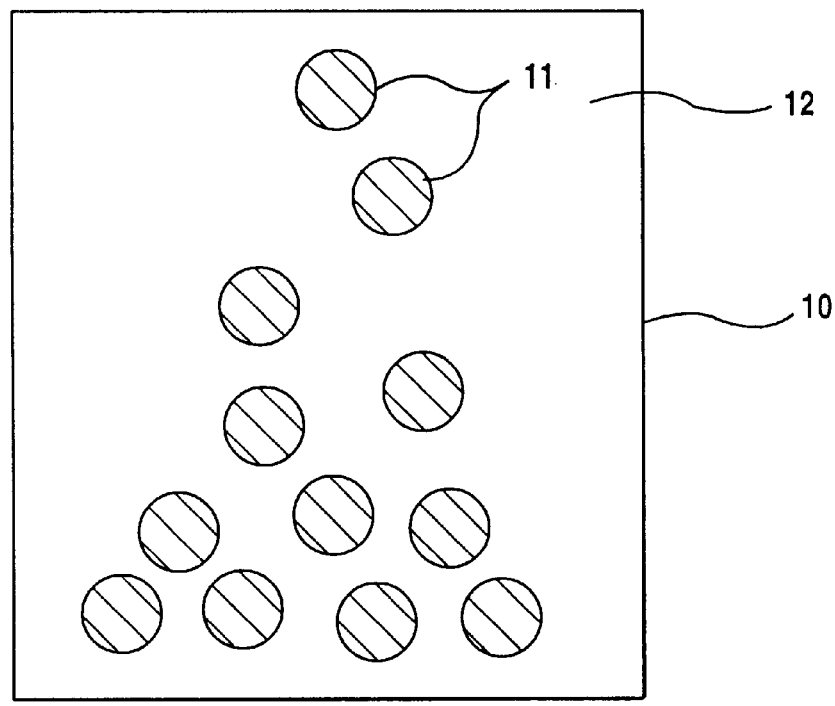
FIG. 1 is a side elevational cross sectional view of a prior-art reinforced composite.

The conventional, non-uniform distribution of reinforcing elements which is detrimental to the performance of a reinforced composite is shown in FIG. 1, which is a cross-sectional view of a prior-art reinforced composite and is denoted as a whole by reference numeral 10. As shown in FIG. 1, the prior-art reinforcing elements 11 have a non-uniform distribution in the composite matrix 12, producing an inferior composite.

The heat-resistant ceramic composite material of this invention consists essentially of a ceramic reinforcement substantially uniformly and stabley dispersed in a liquid metal matrix of the composite material. Techniques for achieving the substantially uniform and stable dispersion or distribution of the ceramic reinforcement is described below.

As described above, the metal matrix is a bonding metallic material generally an alloy of a plurality of metals and selected from the group consisting of a soldering material, a brazing material, and welding material.

As indicated above, soldering, brazing, and welding metallic materials are equally useful for the practice of this invention. Their selection depends solely on the intended usage temperature of the entire electronic system or the circuit board. Hence, soldering methods and soldering metallic materials are exclusively used in this specification for illustration of the preferred embodiments.

Solder materials generally have poor high-temperature mechanical properties particularly on creep, fatigue, and hot tear. The new heat-resistant solider composite is a composite in which special ceramic reinforcing elements are stably and uniformly distributed in the matrix. This improved distribution ensures uniform spacing between the reinforcing elements and enhances load transfer among the reinforcing elements through the intervening solder matrix. Even in narrow-clearance soldered joints, the hard and refractory ceramic reinforcing elements will provide high creep resistance at high temperatures which normally would fail a non-reinforced solder, or a ceramic reinforced composite with non-uniformly distributed reinforcing elements.

For this new solder composite, specially prepared ceramic reinforcing elements are produced to insure stable and uniform distribution in a liquid solder matrix during the soldering operation. Upon solidification of the solder matrix, a ceramic-reinforced solid solder composite is formed in which the uniformly distributed solid reinforcing elements provide the high creep resistance needed.

The unique composite solder will have the following benefits:

1) At high temperatures, even near the melting pint of the solder matrix, the uniformly distributed, rigid and refractory reinforcing elements will prevent uncontrolled creep of the matrix. There will be no overcrowded or underpopulated reinforcing elements anywhere in the solder to cause matrix failures by hot tear, fracture, or creep of the solder matrix;

2) The new composite solder will have reliably uniform, reproducible, and enhanced mechanical properties to withstand high service temperatures normally considered unallowable, because of the uniformly distributed ceramic reinforcing elements with improved load transfer properties between them;

3) The specially prepared ceramic reinforcing element, are surface-coated with metals designed not only to be easily wetted and bonded by the liquid solder for maximum bond strength, but also simultaneously to minimize both surface oxidation of the coated metals and unwanted metals diffusion during the soldering process; and 4) The new composite solder material is designed for use on conventional automatic soldering equipment, without major modification, in the manufacture of heat-resistant printed circuit boards and electronic systems.

A new material and process is, therefore, urgently needed to eliminate this very serious material and thermal problem. This problem must be rapidly solved to eliminated the need for a board-level redesign while minimizing both engineering costs and time-to-market.

The new solution in this application involves the tailor-design and use of a unique heat-resistant composite material in the soldered lead wire connection process. Composites are materials which are not simple metals, ceramics, and glasses or glass ceramics. For improved heat resistance, plastics are eliminated. In the process of this invention, the new composites are reinforced by suspending or embedding solid strengthening or reinforcing elements, such as, ceramic, intermetallic, or glass reinforcing powders, rods, sheets, weaves, or combinations thereof within the composite matrix. The solid reinforcing elements are rigid and heat-resistant and are thus used to make the entire composite matrix more rigid and heat resistant. Many other benefits are achieved by reinforcing composites. For example, reinforced composites can be prepared which resist creep, fatigue, and tensile and shear fractures at temperature which are close to the melting point of the composite matrix.

With such heat-resistant soldered connections, the solder composite will be made heat-resistant and creep-resistant, electrically conductive to reduce heat generation, and thermally conductive to rapidly dissipate the heat generated. Under these modifications and improvements, both the circuit board and the entire electronic systems will become more heat-resistant.

Through the replacement of the low-melting soldering metal alloys by higher-melting metal alloys and the use of brazing or welding processes together with ceramic, rather than plastic, circuit boards, the methods and products of this invention are made even more heat-resistant.

Figure 6:
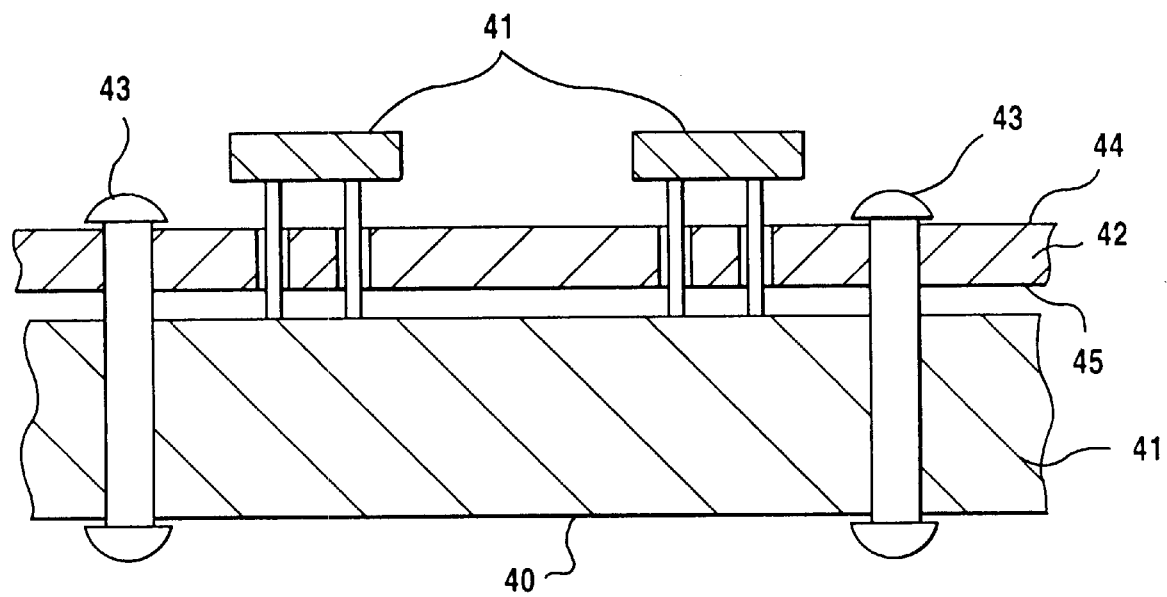
FIG. 6 shows a top view of an electronic system.
Figure 7:
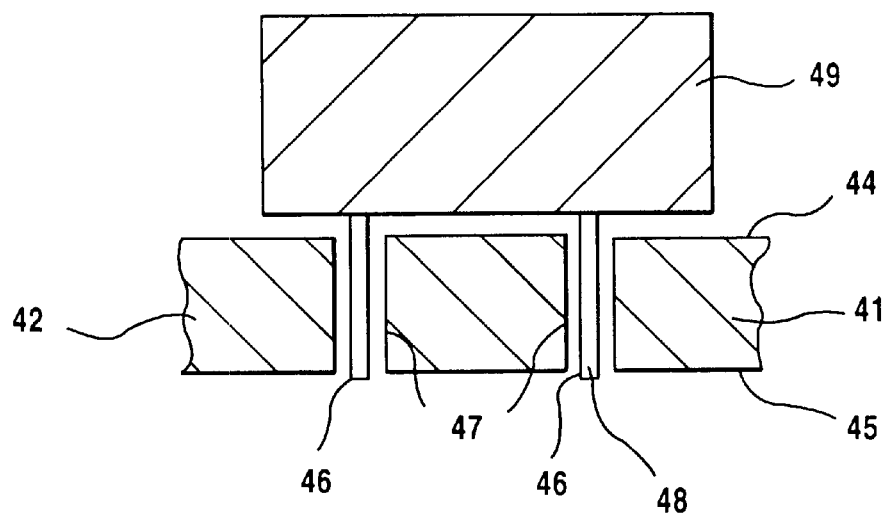
FIG. 7 is an enlarged side cross-sectional view of the electronic system showing the relative positions of the circuit components, circuit board substrate, and the electronic system frame.

The method of making a heat-resistant electronic system containing a plurality of electronic circuit components 49 mounted on a ceramic or plastic circuit board 42 in the system is described below. As shown in FIGS. 6 and 7, the electronic system 40 comprises a frame 41 onto which a circuit board substrate 42 is fixed mounted and attached by, e.g., riveting with rivets 43 as shown, at a specific location of the frame. The circuit board substrate 42 has a top major surface 44 and a bottom major surface 45; and also a number of through holes 46 extending from the top major surface to the bottom major surface of the circuit board substrate.

The internal surfaces of the through holes 46 areas are coated with metallic layers 47 to facilitate their bonding to the lead wires 48 of a fixed number of active or passive circuit components 49 into selected through holes 46 of the circuit board substrate 42. Each of the circuit component has a respective specified number of metallic electrical lead wires 48 which extend, and point in a common direction (i.e., vertically downward) away, from the circuit component for easy insertion of these lead wires into selected ones of the through holes from the top major surface to at least reach a level of the bottom major surface of the substrate. The remaining spaces in all the selected through holes 46 of the substrate 42 is then filled with a heat-resistant ceramic-reinforced composite material comprising solid ceramic reinforcement substantially uniformly and stably dispersed in a metal matrix of the composite material. This heat-resistant ceramic composite material further bonds all the inserted, commonly directed metallic electrical lead wires 48 to the metallic layers 47 coated onto the respective selected through holes 46.

The substantially uniformly and stably dispersed solid ceramic reinforcement in said metal matrix provides heat resistance to the bonds at least between the metallic electrical lead wires 48 and the metallic layers 47 coated onto the respective selected through holes 46, between the metallic layers in their selected through holes and the circuit board substrate 42 and the system frame. This is so even in the presence of the combined thermal mismatch stresses between the metallic electrical lead wires, the coated metallic layers in the selected through holes, the circuit board, and the system frame. In this way, the entire system is made heat-resistant.

These circuit boards can be mounted on a plurality of different frames of an equipment or a system such as an automobile. For instance, the modern automobile may require circuit boards mounted on different frames for engine controls, speed controls, steering control, brake control, noise control and temperature control etc. For very high temperatures near the engine the circuit board/frame will require brazed joints.

Specifically, the new composite has a liquid composite matrix which has a preselected liquid density and contains a plurality of solid reinforcing elements. Each of the solid reinforcing elements has an inner core material and an outer shell material. Specifically, the inner core material has a preselected average radius $r_1$, a preselected average volume $v_1$, a preselected average density $d_1$, and a preselected average weight $w_1$, while the outer shell material has a preselected average radius $r_2$, a preselected average volume $v_2$, a preselected average density $d_2$, and a preselected average weight $w_2$. The resulting reinforcing elements have an average solid density substantially equal to a preselected liquid density of a liquid composite matrix, i.e., $w_1+w_2=(v_1+v_2)\ d_m$. This condition provides a composite matrix having substantially uniform and stable distribution of the solid reinforcing elements in the composite matrix. The mixture is then solidified or frozen, while keeping the desired distribution.

Figure 2:
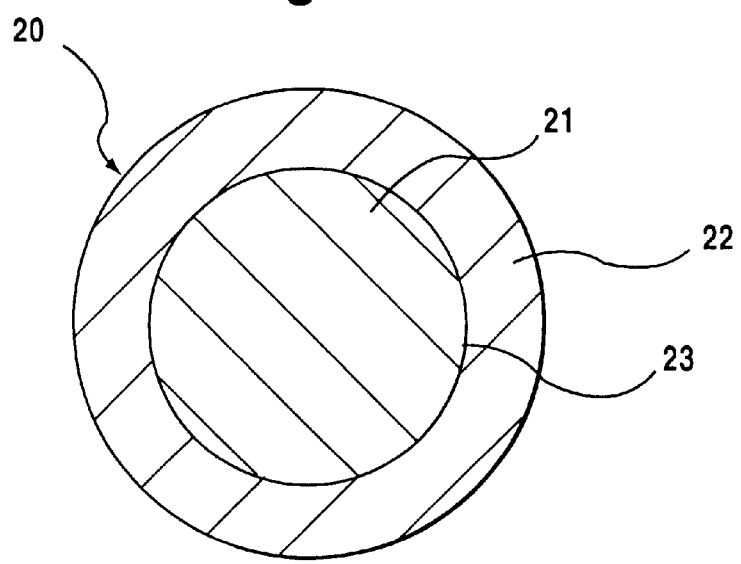
FIG. 2 is a cross-sectional view of a single solid reinforcing element in the form a sphere, of a non-segregating solid reinforcing element of the present invention.

FIG. 2 shows a cross-sectional view, of a non-segregating reinforcing elements of the invention and is denoted as a whole by reference numeral 20. As shown in FIG. 2 the reinforcing element has an inner core material 21, surrounded by an outer shell material 22. An interface 23 is formed between the inner core material 21 and the outer shell material 22. As shown in the drawing, the reinforcing elements of the present invention are microcomposites themselves.

In a preferred embodiment of the present invention an improved composite is formed using solid reinforcing elements which are designed to have the same average density as a preselected liquid matrix, thereby minimizing or eliminating gravitational segregation. Since more common reinforcing elements have densities different from of a matrix, reinforcing elements useful in the present invention are design to have a multi-layered or microcomposite structure.

The solid reinforcing element 20 can be any spherical powder, rod, fiber, or cylinder. For example, the solid reinforcing sphere should ideally have a systematic, hexagonal or face-centered cubic arrangement in the liquid composite matrix. In addition, each powder should have the same number of neighboring powders, and should be spaced at the same distance from its closest neighbors. Further, as is known in the art, it is impossible, during formation of particular reinforcing elements, to obtain absolute uniformity in the size, weight and density of the reinforcing elements. For example, spherical powder reinforcing elements are made of a range of powders having different sizes, weights, and densities, which are averaged to represent an average size, an average weight and an average density.

For illustration, a multi-layered reinforcing element in the form of a spherical powder is described. Specifically, the solid reinforcing spherical powder 20 has an inner spherical core material 21, having an average radius $r_1$, an average volume $v_1=4pr_1^3/3$, an average density $d_1$, and an average weight $w_1=4pd_1r_1^3/3$, where p=pi=3.142. Further, the solid reinforcing spherical powder 20 has an outer solid shell material 22, having an average outer radius $r_2$, a preselected average volume $v_2=4p(r_2^3-r_1^3)/3$, an average density $d_2$, and an average weight $w_2=4pd_2(r_2^3-r_1^3)/3$, where p=pi=3.142.

The non-segregating principles and techniques described herein apply equally, with only obvious modifications, to other shapes of reinforcing elements, such as ellipsoids or plates.

Improved composites are formed when the solid reinforcing non-segregating spherical powders useful in the present invention are freely suspended in a liquid composite matrix of density $d_m$. Hence, the liquid composite matrix of volume $v_m$ must have a weight of $w_m$ which is:

$w_m = 4p\, d_m r_2^3 = (v_1+v_2)d_m = w_{reinforcing\ sphere} = 4p\{d_1 r_1^3/3 + d_2(r_2^3-r_1^3)/3\}$.

Hence, $d_m r_2^3 = r_1^3 d_1 + d_2(r_2^3 - r_1^3)$, or $r_1^3(d_2-d_1) = r_2^3(d_2-d_m)$; and $r_2/r_1 = \{(d_2-d_1)/(d_2-d_m)\}^{(1/3)}$.

Table 1 is derived from the last equation. For example, in order to simplify the calculation, assume that $Al_2O_3$ is the solid core material with a density of d of 3.97 gm/cc, Bi is the solid shell material with a density d of 9.75, and that $r_1$ is equal to 1 unit such as 1 micron or 1 mil and the liquid composite matrix is made up of 50% by weight In and 50% by weight Sn and has a liquid density, $d_m$, of 7.0 gm/cc, according to the equation $r_2 = \{(9.75-3.97)/(9.75-7.0)\}^{(1/3)} = 1.28$ micron or mil depending on the units.

As shown in Table 1, the reinforcing spheres are made of a rigid, heat-resistant inner core material 21, which may be any ceramic material including $Al_2O_3$, MgO, SiC, $SiO_2$, $TiO_2$, and $ZrO_2$ having densities of 3.97 gm/cc, 3.6 gm/cc, 3.16 gm/cc, 2.33 gm/cc, 4.23 gm/cc, and 5.7 gm/cc, respectively. Other inner core materials 21 are also useful in the present invention including: calcium oxide and carbon.

Other shell materials 22 useful in the present invention includes: Bi, Cd, Au, Fe, Pb, Mo, Ni, Ag, W, and Co, with densities of 9.75 gm/cc, 8.65 gm/cc, 19.3 gm/cc, 7.87 gm/cc, 11.4 gm/cc, 10.22 gm/cc, 8.90 gm/cc, 10.5 gm/cc, and 19.3 gm/cc, respectively as shown in Table 1. The outer shell material 22 of the reinforcing elements have densities greater than that of the 7.0 gm/cc liquid composite matrix density, which compensates for the lighter ceramic inner core material.

Each of the inner core ceramic material 21 of the solid reinforcing spheres given below has a lower density, $d_1$, than that of the liquid metallic matrix density of the composite, e.g., 7.0 gm/cc. The outer shell material 22 of the reinforcing elements has a density, $d_2$, which is higher than both the ceramic inner core material density, $d_1$, and the liquid matrix density, of the composite. If the inner core ceramic material 21 has a higher density, the outer shell material 22 must have a density lower than both the inner core material density, $d_1$, and the liquid matrix density of the composite. In general, the outer shell material 22 must have a density $d_2$ which is extrapolated from the inner core material density through the liquid composite matrix density. Specifically, either $d_1 > d_m > d_2$ or $d_1 < d_m < d_2$.

The liquid composite matrix of the composites of the present invention are, for illustrative purposes made up of 50% by weight In and 50% by weight Sn and have a liquid density, of about 7.0 gm/cc. It is desirable to select the composition of the composite matrix alloy so that its component metals have their densities within 10–20%, or even 5%, of each other, or one another at the composite processing temperature $d_m$. Other pairs or groups of metals with sufficiently close densities (at the melting point given in parentheses) include: Al(2.38 gm/cc)—Si(2.57 gm/cc), Mo(5.95 gm/cc)—Ga(6.08 gm/cc), Zn(6.21 gm/cc)—Cr(6.3 gm/cc), Co(7.75 gm/cc)—Ni (7.80 gm/cc), Cd(8.0 gm/cc)—Cu(8.02 gm/cc), Ag(9.32 gm/cc)—Mo(9.33 gm/cc), and Bi(10.05 gm/cc)—Pb(10.66 gm/cc).

TABLE 1

Multi-layered Spherical Reinforcing Powders $r_2/r_1$ Values

| Core Material 1:<br>Density (gm/cc)<br>Shell Material 2:<br>Density (gm/cc) | $Al_2O_3$<br>(3.97) | MgO<br>(3.6) | SiC<br>(3.16) | $SiO_2$<br>(2.33) | $TiO_2$<br>(4.23) | $ZrO_2$<br>(5.7) |
|---|---|---|---|---|---|---|
| Bi (9.75) | 1.28 | 1.31 | 1.34 | 1.67 | 1.40 | 1.09 |
| Cd (8.75) | 1.42 | 1.45 | 1.49 | 1.57 | 1.39 | 1.21 |
| Co (8.90) | 1.31 | 1.41 | 1.45 | 1.51 | 1.35 | 1.19 |
| Au (19.3) | 1.08 | 1.08 | 1.10 | 1.11 | 1.07 | 1.03 |
| Fe (7.87) | 1.65 | 1.70 | 1.76 | 1.85 | 1.61 | 1.36 |
| Pb (11.4) | 1.19 | 1.21 | 1.23 | 1.27 | 1.18 | 1.09 |
| Mo (10.22) | 1.26 | 1.27 | 1.30 | 1.35 | 1.23 | 1.12 |
| Ni (8.90) | 1.37 | 1.41 | 1.45 | 1.51 | 1.35 | 1.19 |
| Ag (10.5) | 1.23 | 1.25 | 1.28 | 1.33 | 1.22 | 1.11 |
| W (19.3) | 1.08 | 1.08 | 1.10 | 1.11 | 1.07 | 1.03 |

The selection of In-Sn alloy as the composite matrix has a desired effect. Because the density of liquid In at its melting point is 7.02 gm/cc, while that of the liquid Sn at its melting point is 6.99 gm/cc. The difference in liquid densities is only 0.03 gm/cc or 0.43% at a temperature between the two melting points. The density of this liquid and solid matrix alloy thus remains substantially constant at about 7.0 gm/cc even with minor variations in the liquid or solid matrix alloy composition (e.g., ±10–20% by weight of In) or even major variations in the liquid or solid matrix alloy composition (e.g., from 0 to 100% by weight of In) due to, e.g., material preparation errors and freezing segregations.

The radius of the inner core material 21 depends on the thickness of the composite, but should generally be less than 200 microns. For example, 20 micron spheres having an $Al_2O_3$ inner core material 21 and a radius of $r_1=10$ microns should be coated with a half-thickness of $(r_2-r_1)$ or 2.8 microns of outer shell or surface coating material 22 of Bi with a $r_2=12.8$ microns. The outer shell, of the present invention has a thickness of from 1 micron to 1 mm. Such solid spherical reinforcing powders will be stably and uniformly distributed in a liquid composite matrix alloy of 50% by weight In-50% by weight Sn and having a liquid density of about 7.0 gm/cc.

One major difficulty with ceramics is that it is very difficult to obtain strong voidless bonds with any coating material including metals and ceramics. However, U.S. Pat. Nos. 5,392,982 and 5,230,924, to Li, which are incorporated herein by reference, disclose bonding methods which overcome various ceramic bonding problems. Hence, a coating or outer shell metal material 22 on a solid reinforcing element's ceramic inner core 21 can be selectively and voidlessly bonded to both the solid core ceramic material 21 and to the composite matrix, to achieve efficient load transfer within each reinforcing element, between neighboring reinforcing elements, and to and from the reinforcing elements relative to the solid composite matrix. Further, a metallized layer on the ceramic inner core material 21 can form a reliable prime coat onto which other metal layers may be added, if needed. These subsequent metal layers are much more easily applied, i.e., wetted to and bonded onto this properly metallized layer on the ceramic inner core than to the ceramic core itself, thereby improving processing reliability and composite product qualities. This is because metal-metal bonding science is better understood than ceramic-metal bonding. The liquid composite matrix can be the other metal layer which can be voidlessly bonded onto the metal 22-coated ceramic core material 21.

The subsequent metal layers may include diffusion barriers formed of refractory metals such as W, Mo, Cr, Pt, and other precious metals such as Pd, Os, Re, and the like. Further, less expensive metals such as Pb, Cu, and Fe may be used to build up the required weight and density of the solid reinforcing elements. In addition, protective and temperature-resistant surface layers such as Au, Al, Cr, Au, and Pt which minimize surface oxidation may be used.

Solid spherical reinforcing powders each containing a solid inner core material and one or more outer shell or surface coating materials in different concentric layers can also be designed and used with equally satisfying results in the present invention. Similar design tables for elongated reinforcing fibers or rods, sheets, weaves, or a combination of these different shapes can also be developed. Various density data is available in CRC Handbook of Chemistry and Physics, D. R. Lide, Ed. In Chief, CRC Press, NY 1996 which is incorporated herein by reference.

Figure 4:
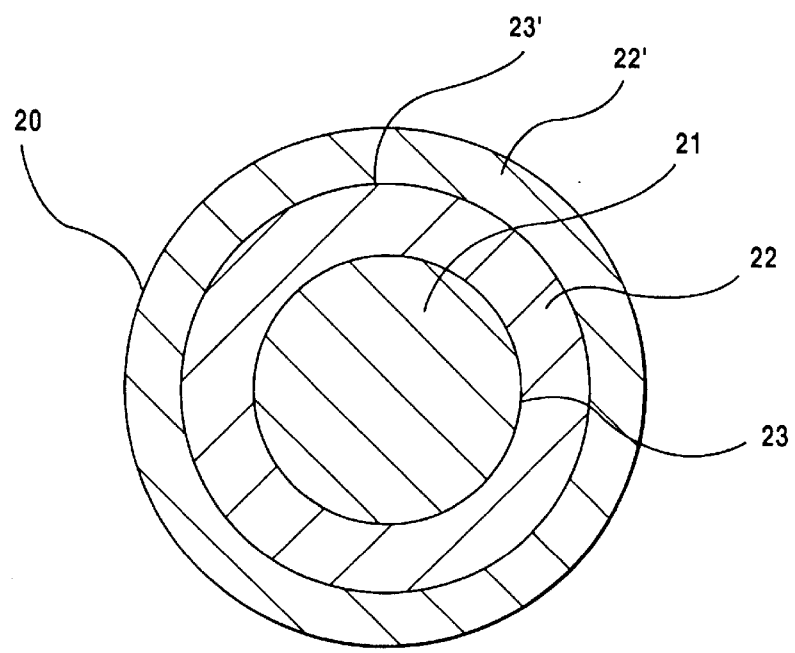
FIG. 4 is a cross-sectional view, of a further embodiment of a non-segregating solid reinforcing element of the present invention.

FIG. 4 shows a cross-sectional view of a further embodiment of a non-segregating reinforcing element of the invention and is denoted as a whole by reference numeral 20. As shown in FIG. 4 the reinforcing element has an inner core material 21, surrounded by an outer shell material 22. An interface 23 is formed between the inner core material 21 and the outer shell material 22. An additional outer shell material 22' surrounds the outer shell material 22 to minimize metal diffusion or surface oxidation. An interface 23' is formed between the outer shell materials 22 and 23.

Materials other than the above ceramics, including metals or metal compounds, are also useful in the present invention as the inner core material 21 of the solid reinforcing elements. In many cases, ceramics can also be used as the outer shell or surface coating material 22. Ceramics are particularly useful because of their refractory properties, hardness, and their ability to function as diffusion barriers.

Those skilled in the art are aware that certain modifications may be necessary due, for example, to the lack of or inaccuracy of available density data. Specifically, the CRC Handbook provides density values for laboratory pure metals, not practical metals containing impurities. Indium has a density of 7.02 gm/cc at its melting point of 156.6° C., while Sn has a density of 6.99 gm/cc at its melting point of 231.9° C. Hence, the 50% by weight In-50% by weight Sn melted alloy for the composite matrix at the composite processing temperature is considered to have a liquid density of about 7.00 gm/cc. Further, the densities of the outer shell or surface coating materials 22, such as Bi, Cd, Co, Au, Fe, Pb, Mo, Ni, Ag, and W are given in the Handbook, but only at 20° C. and not at the actual composite processing temperature. Hence, a few simple experiments in some cases may be needed for precision results.

However, composites designed according to the above parameters give substantially uniform distribution of the suspended solid reinforcing spheres in the liquid 50% by weight In-50% by weight Sn composite matrix. For still better distribution results, the skilled person can perform a few simple tests to determine improved $r_2/r_1$ values. In addition, when more precise and comprehensive density data for impure metals at various composite processing temperatures become available the skilled person can even replace the estimated density values used in the above table with the exact values by a revised calculation using the improved density data but still according to the formula given above.

Other factors which may require consideration by the skilled artisan in practicing the present invention include the interaction and interdiffusion between the different materials, new phase formations with their associated volume and density changes, and solidification effects due to, e.g., freezing solute segregation according to the phase diagram, and other temperature effects including those due to solute segregation arising from freezing temperature gradients. Yet another factor to consider is that the liquid composite matrix is an alloy rather than a pure metal and is therefore continuously undergoing freezing, solute segregation, and density changes, according to its phase diagram. Further, liquid density generally decreases with increasing temperature.

Eutectic alloys are particularly useful in the present invention. Each simple eutectic alloy has the lowest melting point for the entire alloy system, lowering the alloy freezing and composite processing temperature. The eutectic also freezes at its singular melting point in a freezing range of temperatures as for non-eutectic alloys. Further, during freezing, non-eutectic alloys continuously changes temperature, compositions, and densities. In contrast, the eutectic alloy always freezes out at one singular composition (i.e., eutectic composition) at the singular eutectic temperature with, therefore, one singular liquid density. These features eliminated or minimize changes in the liquid composite density due to variations in freezing temperatures and alloy compositions, freezing solute segregations according to the phase diagram, and freezing temperature gradients leading to composition and density gradients. A composite matrix alloy having a eutectic composition or nearly eutectic composition will, therefore, greatly simplify the control of the matrix density and, therefore, the uniform distribution of the solid reinforcing elements therein.

Figure 3:
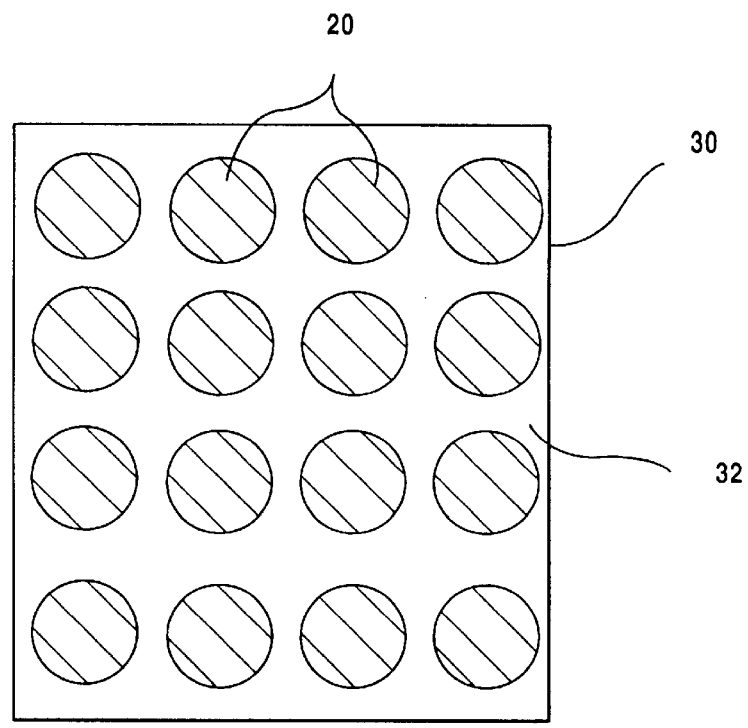
FIG. 3 is a side elevational cross sectional view, of an improved reinforced composite which is reinforced with a plurality of uniformly distributed non-segregating reinforcing elements of the present invention.
Figure 5:
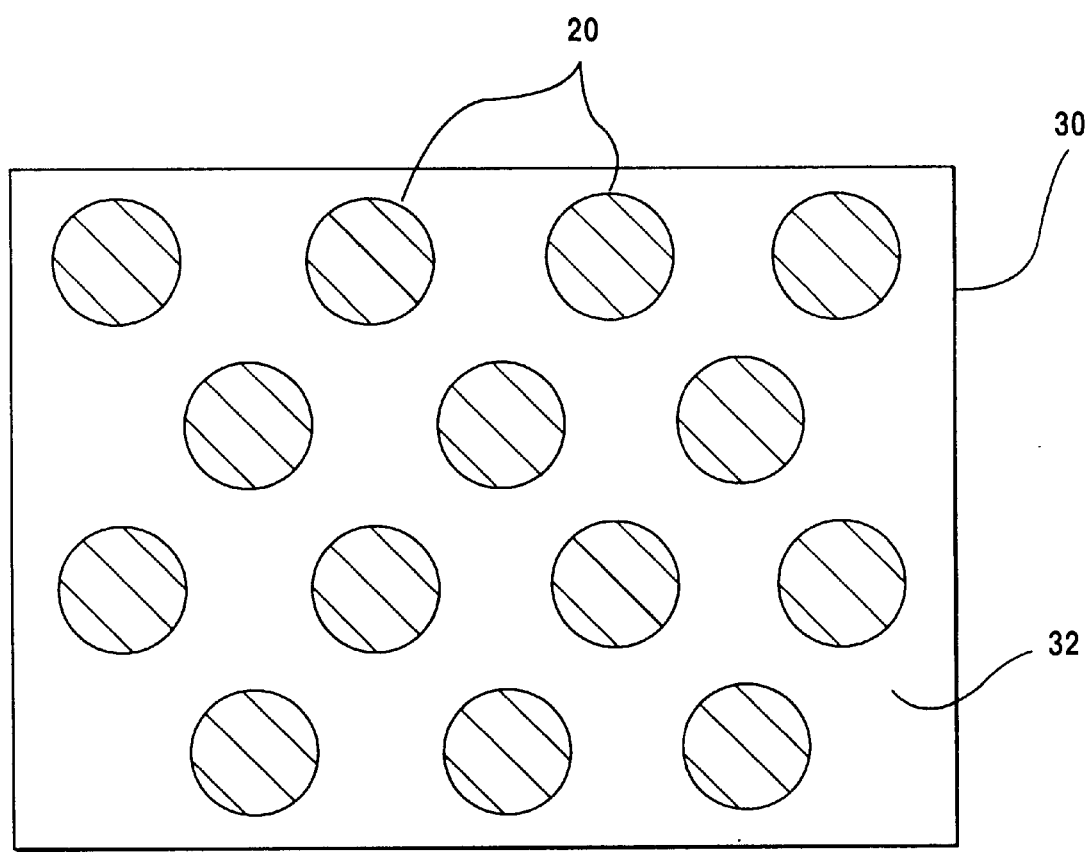
FIG. 5 is a side elevational cross sectional view, of a further embodiment of an improved reinforced composite which is reinforced with a plurality of non-segregating reinforcing elements of the present invention.

The uniform distribution of reinforcing elements which is achieved in accordance with the present invention is shown in FIGS. 3 and 5, which are cross-sectional views of inventive reinforced composites, respectively and are denoted as a whole by reference numeral 30. As shown in FIGS. 3 and 5 the inventive reinforcing elements 20 have a uniform distribution in the composite matrix 32.

The present invention minimized interdiffusion and interaction among different component materials by using surface layers of inert or high-temperature diffusion barriers of W, Mo, Cr, Ti, or even of ceramics such as those given as the core materials 21 listed above. Further, differing composite shape, size, and depth/width ratio (or aspect ratio) affects the temperature profile or gradient during freezing, local accumulation of the settling solid reinforcing elements, or depletion of liquid composite matrix metal, and their associated changes in alloy freezing behaviors. Again, the eutectic matrix alloy with equal or nearly equal density matrix composites described above is very useful to achieve substantially uniform distribution of the solid reinforcing elements both in the initial liquid suspension, and in the subsequently solidified composite matrix.

Modifications to the composite structure and the solid reinforcing element design described fall within the scope of the instant invention. For example, the surface layer or layers may uniformly cover the entire outer surface of the solid reinforcing elements, or a heavier metal may be partially coated onto only one side of the solid reinforcing element. In a liquid composite matrix, this partially coated solid reinforcing element will automatically orient itself to locate the heavier, metal coated side at the bottom therefore achieving oriented and aligned solid reinforcing elements in the composite matrix.

In addition, the ceramic core of the solid reinforcing element may be surface coated by spraying, dipping, or fluidizing with the usual W-Fe and Mo-Mn ceramic metallizing composition, to be further heated to 1200° C. for the required fusion ceramic-cored solid reinforcing element. Diluted metallizing solution containing both mettallizers (W,Mo) and brazers (Cu, Zn, Br, Fe, Mn) can produce complete adherent metal-bonded thin layers 1 micron to 100 Å with a thickness accuracy to 10–100 Å. Se Li U.S. patent application Ser. No. 08/301,582 filed Sep. 7, 1994 and herein incorporated by reference. Further, the shape of solid reinforcing elements is not necessarily limited to simple shapes such as spheres, cylinders, sheets, or weaves. Tiny structures with complicated shapes having a number of these shapes in combination may be desirable in many cases.

The substantially uniformly and stably dispersed solid ceramic reinforcement in the metal matrix now provides heat resistance to the bonds between the metallic electrical lead wires and the metallic layers coated onto the respective selected through holes, even in the presence of thermal mismatch stresses only between the metallic electrical lead wires, the coated metallic layers in the selected through holes, and the circuit board, because there is now no mismatch thermal stresses between the circuit board and the electronic system frame, which is here absent.

Potential applications for various industries include high-temperature automobile sensors and controls, deep-well drilling equipment, jet engines or gas turbines, and electronic applications such as high-speed processors, cellular phones, and lap-top personal computers. Other applications are high-temperature engine sensors, high-power microwave systems, power suppliers, and radiation hard equipment.

It will thus be seen that the objects set forth above, and those made apparent from the foregoing description, are efficiently attained and since certain changes may be made in the foregoing description without departing from the scope of the invention, it is intended that all matters contained in the foregoing description or shown in the accompanying drawings shall be interpreted as illustrative and not in a limiting sense.

While the illustrated embodiments given in this specification employ certain forms of composite design and processing procedures, other embodiments may employ other composite designs to be achieve with other processing procedures. Still other alternatives in the composite designs and procedures are possible. Some techniques are provided for the alterative approaches toward fulfilling the objects of the invention.

It is also to be understood that the following claims are intended to cover all of the generic and specific features of the invention herein described, and all statements of the scope of the invention which, as a matter of language, might be said to fall therebetween.

Although only a few exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention as defined in the following claims. In the claims, means-plus-function clause are intended to cover the structures described herein as performing the recited function and not only structural equivalents but also equivalent structures. Thus although a nail and a screw may not be structural equivalents in that a nail employs a cylindrical surface to secure wooden or other soft material parts together, whereas a screw employs a helical surface, in the environment of fastening parts, a nail and a screw may be equivalent structures.

What is claimed is:

1. A method of making a heat-resistant system containing a plurality of electronic circuit components mounted on a circuit board in the system, comprising:

providing a frame to form a part of said system;

supplying a circuit board substrate in the form of a ceramic or plastic board which is fixedly attached at a specific location onto the frame of said system;

said substrate having a top major surface and a bottom major surface, and also having a plurality of wall means defining a plurality of through holes extending from the top major surface to the bottom major surface of said substrate;

coating a metallic layer onto the respective wall means of each of selected through holes on said substrate;

providing a number of active or passive electronic circuit components a plurality of which each having a respective specified number of metallic electrical lead wires which extend, and point in a common direction away, from said circuit component;

inserting said commonly directed, metallic electrical lead wires into selected ones of said through holes from the top major surface to at least reach a level of the bottom major surface of said substrate; and filling remaining spaces in the selected through holes of said substrate with a heat-resistant ceramic-reinforced composite material comprising a solid ceramic reinforcement substantially uniformly and stably dispersed in a metal matrix of said composite material;

said heat-resistant ceramic composite material further bonding all the inserted, commonly directed metallic electrical lead wires to the metallic layers coated onto the respective wall means of said selected through holes;

said substantially uniformly and stably dispersed solid ceramic reinforcement in said metal matrix providing heat resistance to the bonds at least between said metallic electrical lead wires and said metallic layers coated onto the respective wall means of said selected through holes, between the metallic layers in said selected through holes and said circuit board substrate, and between said circuit board substrate and said system frame, despite the presence of combined thermal mismatch stresses between various bonded or coated materials, whereby the entire system is made heat-resistant.

2. The method as in claim 1 wherein said heat-resistant ceramic composite material comprises:

said liquid metal matrix having a preselected liquid density; and said ceramic reinforcement in the form of a plurality of solid reinforcing elements contained in said liquid metal matrix; and including forming each of said reinforcing elements to have an average density substantially equal to said preselected liquid density thereby achieving substantially uniform and stable distribution of said solid reinforcing elements in said metal matrix.

3. The method as in claim 1 including choosing said metal matrix to be a bonding metallic material selected from the group consisting of soldering material, brazing material, and welding material.

4. The method as in claim 1 wherein said bonding metal-matrix composite material is selected from the group consisting of soldering material, brazing material, and welding material.

5. The method as in claim 1 wherein solid ceramic reinforcement comprises a plurality of ceramic reinforcing elements selected from the group consisting of powders, fibers, rods, sheets, weaves, tiny structures with complicated shapes, and combinations thereof; and including mixing the plurality of said solid reinforcing elements and said metal matrix to provide a mixture having a preselected liquid density of $d_m$.

6. The method as in claim 5 wherein each of said reinforcing elements comprises an inner core material and an outer shell material thereon;

said shell material has an average density $d_2$ and an average volume $v_2$ such that each of said reinforcing elements has an average density which is substantially equal to a preselected liquid density of said liquid matrix metal $d_m$ to thereby substantially uniformly and stably distribute said reinforcing elements in said liquid metal matrix for forming a heat-resistant ceramic composite mixture and including:

freezing said ceramic composite mixture under conditions sufficient to achieve a substantially uniform distribution of said reinforcing elements in said frozen metal matrix.

7. The method of claim 6 wherein said inner core material has a preselected average radius or half thickness $r_1$, a preselected average volume $v_1$, a preselected average density $d_1$ an a preselected average weight $w_1$; and said outer shell material has a preselected average radius or half thickness $r_2$ a preselected average volume $v_2$, and a preselected average weight $w_2$; and wherein a plurality of said solid reinforcing elements including said core material and said shell material has an average solid density substantially equal to the preselected liquid density of said liquid metal matrix $d_m$.

8. The method according to claim 7 wherein $w_1+w_2=(v_1+v_2) \times d_m$.

9. The method according to claim 7 wherein:

said solid reinforcing elements are generally spherical powders; said inner core material has a preselected average radius or half thickness $r_1$; said shell material has a preselected average outer shell radius or half thickness $r_2$; and including:

forming a plurality of said reinforcing elements to comprise said core material of said preselected average weight $w_1$ and said shell material of said preselected average weight $w_2$ such that said average solid density is substantially equal to the preselected liquid density of said liquid metal matrix $d_m$.

10. The method of claim 7 wherein the average $r_1$ and $r_2$ are derived from the equation $r_2/r_1=\{(d_2-d_1)/(d_2-d_m)\}^{(1/3)}$].

11. The method of claim 5 wherein the solid reinforcing elements have a common radius or half-thickness of from 1 to 200 microns.

12. The method of claim 7 wherein the outer shell radius or half-thickness of said solid reinforcing elements is from 1 micron to 1 mm.

13. The method according to claim 7 wherein the liquid metal matrix is a metal alloy having a plurality of metal components with melting points sufficiently close to each other or one another to significantly facilitate control of said preselected liquid density of said liquid metal matrix.

14. The method of claim 5 wherein said liquid metal matrix is a metal alloy having a plurality of metal components with melting points within 10% of each other or one another, thereby facilitating control of said preselected liquid density of said liquid metal matrix.

15. The method of claim 14 wherein at least plurality of said solid reinforcing elements are ceramics selected from the group consisting of alumina, magnesia, silica, zirconia, calcium oxide, titanium dioxide, carbon, graphite, diamond, silicon carbide, and metal compounds.

16. The method of claim 5 wherein said liquid metal matrix is a eutectic material, thereby allowing processing of said composite material to be carried out at a low temperature.

17. The method according to claim 7 including forming at least a selected portion of an outer surface of said outer shell material to consist essentially of a metal which is much more easily wetted to the liquid metal matrix and bonded onto the solidified metal matrix, thereby improving processing reproducibility and composite product qualities.

18. A method of making a heat-resistant circuit board containing a plurality of electronic circuit components thereon, comprising:

providing a circuit board substrate in the form of a ceramic or plastic board having a top major surface and a bottom major surface;

forming in said substrate a plurality of wall means defining a plurality of through holes which extend from the top major surface to the bottom major surface of said substrate;

coating a metallic layer onto the respective wall means of each of selected through holes on said substrate;

supplying a plurality of active or passive electronic circuit components, a plurality of said components each having a respective specified number of metallic electrical lead wires which extend, and point in a common direction away from said circuit components;

inserting said commonly directed, metallic electrical lead wires into said selected through holes from the top major surface to at least reach a level of the bottom major surface of said substrate;

filling remaining spaces in at least a plurality of said selected through holes of said substrate with a heat-resistant ceramic composite material consisting essentially of a solid ceramic reinforcement substantially uniformly and stably dispersed in a metal matrix of said composite material; and bonding with said heat-resistant ceramic composite material all the inserted, metallic electrical lead wires to the metallic layers coated onto the respective wall means of said selected through holes;

said substantially uniformly and stably dispersed solid ceramic reinforcement in said metal matrix providing heat resistance to the bonds at at least between said metallic electrical lead wires and said metallic layers coated onto the respective wall means of said selected through holes, and between the coated metallic layers in the selected through holes and said circuit board substrate, despite presence of combined thermal mismatch stresses between various different bonded or coated materials, whereby the entire circuit board is made heat-resistant.

19. A method of making a heat-resistant circuit board containing a plurality of electronic circuit components thereon, comprising:

providing a circuit board substrate in the form of a plate with at least a top electrically insulating, ceramic, plastic, or other material layer on a top major surface thereof;

defining on said insulating material layer a plurality of mounting locations for mounting thereat a plurality of active or passive electronic circuit components;

coating a metallic layer at each of the mounting locations on said substrate;

supplying said plurality of electronic circuit components;

mounting the plurality of electronic circuit components onto the metallic layers at said defined locations on the substrate with a heat-resistant and metal-layer wetting, composite material consisting essentially of solid reinforcing elements substantially uniformly and stably dispersed in a liquid metal matrix of said composite material; and bonding all the electronic circuit components with an originally metal-wetting but subsequently frozen solid, heat-resistant composite material onto the defined locations on said metallic layers coated onto said substrate, despite presence of combined thermal mismatch stresses between various different bonded or coated materials, whereby the entire circuit board is made heat-resistant.

20. The method as in claim 19 including:

providing a frame to form a part of said system;

mounting with a mounting stress the frame onto a mounting position on said system, and wherein said substantially uniformly and stably dispersed solid reinforcing elements in said metal matrix providing heat resistance to the bonds at least between the circuit components and the metallic layers coated at the mounting locations on said substrate, between the metallic layers and the substrate, and between the substrate and the frame, and combined thermal mismatch stresses between various bonded, coated, or mounted materials, whereby the system is made heat-resistant.

21. The method as in claim 19 wherein said heat-resistant elements-reinforced composite material consists essentially of a plurality of solid reinforcing elements uniformly and stably dispersed in said liquid metal matrix of said composite material.

22. The method as in claim 19 wherein said heat-resistant composite material comprises:

said liquid metal matrix having, in a liquid form, a preselected liquid density; and said reinforcing elements are in the form of a plurality of solid reinforcing elements contained in the liquid metal matrix, and including:

forming each of the reinforcing elements to have an average density substantially equal to the preselected liquid density thereby achieving substantially uniform and stable distribution of the solid reinforcing elements in said metal matrix.

23. The method as in claim 19 including choosing the metal matrix to be a bonding metallic material selected from the group consisting of soldering material, brazing material, and welding material.

24. The method as in claim 22 wherein solid reinforcing elements comprise a plurality of ceramic reinforcing elements selected from the group consisting of powders, fibers, rods, sheets, weaves, tiny structures with complicated shapes, and combinations thereof; and including mixing said plurality of said reinforcing elements and said metal matrix to provide a liquid suspension mixture having a preselected liquid density of $d_m$.

25. The method as in claim 24 wherein each of said reinforcing elements comprises an inner core material and an outer shell material thereon;

said shell material has an average density $d_2$ and an average volume $v_2$ such that each of said reinforcing elements has an average density which is substantially equal to the preselected liquid density of said liquid matrix metal $d_m$ to thereby substantially uniformly and stably distribute said reinforcing elements in said liquid metal matrix for forming a heat-resistant ceramic composite mixture and including:

freezing the ceramic-metal composite mixture under conditions sufficient to achieve a substantially uniform distribution of the reinforcing elements in said frozen metal matrix.

26. The method of claim 25 including forming at least a selected portion of an outer surface of said outer shell material to consist essentially of a metal which is much more easily wetted to the liquid metal matrix and bonded onto the solidified metal matrix, thereby improving processing reproducibility and composite product qualities.

27. The method of claim 25 wherein said inner core material has a preselected average radius or half thickness $r_1$, a preselected average volume $v_1$, a preselected average density $d_1$, an a preselected average weight $w_1$; and said outer shell material has a preselected average radius or half thickness $r_2$, a preselected average volume $v_2$, a preselected average density $d_2$, an a preselected average weight $w_2$; and wherein each of said solid reinforcing elements including said core material and said shell material has an average solid density substantially equal to the preselected liquid density of said liquid metal matrix $d_m$.

28. The method of claim 26 wherein $w_1+w_2=(v_1+v_2) \times d_m$.

29. The method of claim 28 wherein:

said solid reinforcing elements are generally spherical powders; said inner core material has a preselected average radius or half thickness $r_1$; said shell material has a preselected average outer shell radius or half thickness $r_2$; and including:

forming a plurality of said reinforcing elements to comprise said core material of said preselected average weight $w_1$ and said shell material of said preselected average weight $w_2$ such that said average solid density is substantially equal to the preselected liquid density of said liquid metal matrix $d_m$.

30. The method of claim 28 wherein the average $r_1$ and $r_2$ are derived from the equation $r_2/r_1=\{(d_2-d_1)/(d_2-d_m)\}^{1/2}$.

31. The method of claim 22 wherein the solid reinforcing elements have a common radius or half thickness of no more than 1 mm.

32. The method of claim 22 wherein the outer shell radius or half-thickness of said solid reinforcing elements is of no more than 1 mm.

33. The method of claim 22 wherein the liquid metal matrix is a metal alloy having a plurality of metal components with melting points sufficiently close to each other or one another to significantly facilitate control of said preselected liquid density of said liquid metal matrix.

34. The method of claim 22 wherein the liquid metal matrix is a metal alloy having a plurality of metal components with melting points within 10% of each other or one another, thereby facilitating control of said preselected liquid density of said liquid metal matrix $d_m$.

35. The method of claim 22 wherein at least a plurality of said solid reinforcing elements are ceramics selected from the group consisting of alumina, magnesia, silica, zirconia, calcium oxide, titanium dioxide, carbon, graphite, diamond, silicon carbide, and metal compounds.

36. The method of claim 22 wherein said liquid metal matrix is a eutectic material, thereby allowing processing of said composite material to be carried out at a low temperature.

37. The method of claim 22 wherein said shell material has a density of no more than 19.3 grams per cubic centimeter.

38. A method of making a heat-resistant system having a mounting substrate and a plurality of components thereon, comprising:

providing said mounting substrate having at least an electrically insulating material layer on a top surface thereof;

defining on said insulating material layer a plurality of mounting locations for mounting thereat a plurality of said components;

forming a metallic layer at each of the mounting locations on said substrate;

supplying the plurality of said components;

mounting the plurality of said components onto the metallic layers with a heat-resistant and metal-layer wetting, liquid composite mixture consisting essentially of a plurality of solid reinforcing elements substantially uniformly and stably dispersed in a solidifiable liquid metal matrix of said liquid composite mixture;

wetting both said metal layers on said substrate and selected portions of said components with said liquid composite mixture;

solidifying said liquid composite mixture at the defined locations under conditions to maintain said solid reinforcing elements still substantially uniformly and stably dispersed in a solidified metal matrix of said composite material;

individually said components, mounting substrate, metal layers, solidified metal matrix, and solid reinforcing elements being all heat-resistant for a specific service; and bonding with said solidified metal-matrix composite material the selected portions of said components onto said metallic layers on said substrate, sufficiently strongly to provide said heat resistance despite presence of combined thermal mismatch stresses between various different bonded or coated materials whereby the entire system is made heat-resistant.

39. The method of claim 38 wherein said mounting steps comprises mounting the components on the substrate with a heat-resistant and metal-layer wetting, composite material in a layer form of no more than 5 mils thick to produce substantially uniformly and stably dispersion of the solid reinforcing elements in the liquid or solidified metal matrix of said composite material even in the layer form.

40. The method of claim 38 wherein said composite matrix material is selected from the group consisting of a metal, and a metal alloy.

41. The method as in claim 38 wherein said reinforcing elements are in a substantially constant but systematic geometrically arrangement and each reinforcing element having approximately the same number of closest neighbors and being spaced at approximately the same distance from said closest neighbors.

42. The method as in claim 38 including:

providing a casting mold for the liquid composite material to cast thereinto;

casting into the mold said liquid composite material with the solid reinforcing elements substantially uniformly and stably dispersed therein; and allowing the liquid composite material cast into said casting mold to freeze under conditions to maintain the substantially uniform distribution of the solid reinforcing elements in the finished solid composite material to avoid overcrowded or underpopulated reinforcing elements anywhere in the bonding composite material thereby minimizing composite matrix failures by hot tear, fracture, or creep.

43. The method as in claim 38 including providing on each of said solid reinforcing elements a surface coating to improve its wettability to said liquid composite matrix for improved solid composite strength.

44. The method as in claim 38 including providing on each of said solid reinforcing elements a surface coating to improve its wettability to said liquid composite matrix for enhanced mechanical properties so that the heat-resistant system board can withstand service temperatures normally considered unallowable because of the uniformly distributed solid reinforcing elements with improved load transfer properties therebetween.

45. A method of making a system having a mounting substrate and a plurality of components mounted thereon, comprising:

providing said mounting substrate having an electrically insulating top surface;

defining on said top surface a plurality of mounting locations for mounting thereat the plurality of said components;

supplying the plurality of said components;

mounting the plurality of said components at said defined locations with a wetting, liquid composite mixture consisting essentially of a plurality of solid reinforcing elements substantially uniformly and stably dispersed in a solidifiable liquid metal matrix of said liquid composite mixture;

wetting with said liquid composite matrix both selected portions of said components and said substrate at said defined mounting locations;

solidifying the top surface of said liquid composite mixture at the defined locations under conditions to maintain said solid reinforcing elements still substantially uniformly and stably dispersed in a solidified metal matrix of said composite material;

individually said components, mounting substrate, solidified metal matrix, and solid reinforcing elements being all heat-resistant for a specific service; and bonding with said solidified metal-matrix composite material the selected portions of said components onto said substrate, sufficiently strongly to provide said heat resistance despite presence of combined thermal mismatch stresses between various different bonded or coated materials whereby the entire system is made heat-resistant.

46. The method of claim 45 wherein said composite matrix material is selected from the group consisting of a metal, and a metal alloy.

47. The method as in claim 45 wherein said reinforcing elements being in a substantially constant but systematic geometrically arrangement and each reinforcing element having approximately the same number of closest neighbors and being spaced at approximately the same distance from these closest neighbors.

48. The method as in claim 45 including:

providing a casting mold for the liquid composite material to cast thereinto;

casting into the mold said liquid composite material with the solid reinforcing elements substantially uniformly and stably dispersed therein; and allowing the liquid composite material cast into said casting mold to freeze under conditions to maintain the substantially uniform distribution of the solid reinforcing elements in the finished solid composite material whereby overcrowded or underpopulated reinforcing elements anywhere in the bonding composite material are avoided thereby minimizing matrix composite matrix failures by hot tear, fracture, or creep.

49. The method as in claim 45 including providing on each of said solid reinforcing elements a surface coating to improve its wettability to said liquid composite matrix for enhanced mechanical properties so that the heat-resistant system board can withstand service temperatures normally considered unallowable because of the uniformly distributed solid reinforcing elements with improved load transfer properties between.

50. The method as in claim 45 wherein said mounting step comprises forming said liquid composite mixture to have, throughout the entire volume of the composite mixture, substantially the same number of said solid reinforcing elements in each unit volume of the mixture;

said reinforcing elements being in a substantially constant but systematic geometrically arrangement and each reinforcing element having approximately the same number of closest neighbors and being spaced at approximately the same distance from these closest neighbors.

* * * * *